(12) United States Patent
Tatewaki

(10) Patent No.: US 7,898,311 B2
(45) Date of Patent: Mar. 1, 2011

(54) PHASE SHIFTING CIRCUIT WHICH PRODUCES PHASE SHIFT SIGNAL REGARDLESS OF FREQUENCY OF INPUT SIGNAL

(75) Inventor: Masafumi Tatewaki, Kanagawa (JP)

(73) Assignee: Renesas Elecronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 12/457,967

(22) Filed: Jun. 26, 2009

(65) Prior Publication Data
US 2010/0001775 A1     Jan. 7, 2010

(30) Foreign Application Priority Data
Jul. 3, 2008     (JP) .............................. 2008-174192

(51) Int. Cl.
*H03H 11/16* (2006.01)
(52) U.S. Cl. ..................... 327/231; 327/236; 327/53; 327/56
(58) Field of Classification Search ........... 327/231, 327/233, 235, 236, 256, 7, 51, 52, 53, 56, 327/63, 66
See application file for complete search history.

(56) References Cited

U.S. PATENT DOCUMENTS

| | | | |
|---|---|---|---|
| 4,529,891 A * | 7/1985 | Oida | 327/77 |
| 5,629,645 A * | 5/1997 | Okajima et al. | 327/399 |
| 5,774,166 A * | 6/1998 | Kazuyuki | 347/248 |
| 5,808,498 A | 9/1998 | Donnelly et al. | 327/255 |
| 6,157,259 A * | 12/2000 | Dasgupta | 330/296 |
| 6,586,922 B2 | 7/2003 | Saeki et al. | 324/76.78 |

FOREIGN PATENT DOCUMENTS

| | | |
|---|---|---|
| JP | 11-505987 | 5/1999 |
| JP | 2001-177391 A | 6/2001 |
| JP | 2001-345677 A | 12/2001 |

* cited by examiner

*Primary Examiner*—An T Luu
(74) *Attorney, Agent, or Firm*—McGinn Intellectual Property Law Group, PLLC

(57) ABSTRACT

A waveform generating circuit includes a constant current circuit that supplies a constant current through a power source; a current mirror circuit that flows an output current that is n times an input current; and a switching circuit that switches a flowing direction of the current in the constant current circuit between the current mirror circuit and the output terminal according to the logical level of the rectangle input signal. The waveform generating circuit generates a triangle wave having a falling slope waveform that is n times the rising slope. On the other hand, the waveform generating circuit that receives an inverted signal of the signal generates a triangle wave and its voltage is compared with another in the comparator to generate an output signal.

12 Claims, 5 Drawing Sheets

PHASE SHIFTING CIRCUIT WHICH PRODUCES PHASE SHIFT SIGNAL REGARDLESS OF FREQUENCY OF INPUT SIGNAL

INCORPORATION BY REFERENCE

This application is based upon and claims the benefit of priority from Japanese Patent Application No. 2008-174192 which was filed on Jul. 3, 2008, the disclosure of which is incorporated herein in its entirety by reference.

BACKGROUND OF THE INVENTION

1. Field of the Invention

The present invention relates to a phase shifting circuit, and more particularly to a phase shifting circuit capable of shifting the phase of each rectangle wave input signal by a predetermined degree to output the phase-shifted signal.

2. Description of Related Art

Phase shifting circuits have been used in various fields, for example, for demodulating signals in communications, for generating multiphase clocks in computers, etc., so as to input cyclical clock signals and output clock signals having phases shifted by a predetermined amount respectively.

FIG. 5 is a block diagram of a conventional phase shifting circuit disclosed in the patent document 1. In the circuit, constant current circuits 18a and 18b are used to charge capacitors 16a and 16b and comparators 14a and 14b are used to delay input signals A and A' until the charged potentials exceed the potentials of reference power supplies 20a and 20b respectively, thereby the phases of the input signals are shifted by a predetermined time and output, respectively.

The patent document 2 discloses a phase shifting circuit, in which a pair of differential gates input complementary signals, a resistor, and a capacitor are connected between the drains of the pair of gates to output a pair of complementary triangle wave signals, which are then shaped by a comparator to output each input clock signal delayed by 90°.

[Patent document 1] Japanese Patent Application Laid Open No. 2001-345677

[Patent document 2] Japanese Patent Application Laid Open (Translation of PCT Application) No. 11(1999)-505987

SUMMARY

In some cases, according to how the subject phase shifting circuit is to be used, the phase difference between input and output signals is required to be set at a predetermined value regardless of the input signal frequency. For example, in case of a gyro-sensor signal processing circuit, a phase shifting circuit is used to shift the phase of a certain frequency to be obtained by a vibrator that vibrates with a specific frequency and to output the phase-shifted signals. How much the phase is to be shifted by the phase shifting circuit, that is, the phase shifting degree comes to affect the sensitivity of the gyro-sensor. Thus the phase shifting degree must be determined appropriately to the vibrator. The vibration frequency differs among vibrators and the difference of the vibration frequency among those vibrators causes a frequency variation among input signals to the phase shifting circuit.

In case of the phase shifting circuit disclosed in the patent document 1, the shifting degree depends on the frequency of the input signal. In the case of the phase shifting circuit disclosed in the patent document 2, the phase shifting degree is set only at 90°. Under such circumstances, there has been demanded a phase shifting circuit capable of setting a phase shifting degree more flexibly regardless of the frequency of the input signal.

It is noted that the patent document 3 also discloses a differential output buffer capable of correcting each cross-point deviation.

[Patent document 3] Japanese Patent Application Laid Open No. 2001-177391

In one exemplary aspect of the present invention, a phase shifting circuit includes a first waveform generating circuit that inputs a first signal and outputs a first waveform, a second waveform generating circuit that inputs an inverted signal of the first signal and outputs a second waveform, and a comparator that inputs the first and second waveforms and outputs a signal having a predetermined phase difference from the first signal. Each of the first and second waveform generating circuits includes a constant current circuit connected to a first power supply, a current mirror circuit having an output connected to an output terminal and used to flow a current between the output and a second power supply, the current being n times (n: a real number of 1 or more) the current flowing between an input and the second power supply, a switching circuit that outputs a current to the output terminal, the current to be flown to the constant current circuit when the input signal to the waveform generating circuit is on a first level and outputs a current to the input, the current to be flown to the constant current circuit when the input signal is on a second level; and a capacitance connected between the output terminal and a fixed potential. The predetermined phase difference depends on the n value of the current mirror circuit.

In another exemplary aspect of the present invention, the phase shifting circuit includes a first waveform generating circuit that inputs a first signal and outputs a first waveform, which rises or falls at a first slope from a first voltage when the first signal is on the first level and falls or rises up to the first voltage from the peak of the rising or falling at a second slope that is n times (n: a real number of 1 or more) the first slope when the first signal level changes from the first level to the second level, a second waveform generating circuit that inputs an inverted signal of the first signal and outputs a second waveform that rises or falls from the first voltage at practically the same slope as the first slope when the first signal is on the second level and falls or rises up to the first voltage from the peak of the rising or falling at practically the same slope as the second slope when the first signal level changes from second to first; and a comparator that inputs the first and second waveforms and outputs a signal having a phase difference that depends on the n value from the first signal.

In still another exemplary aspect of the present invention, each waveform generating circuit inputs a rectangular wave signal and generates a pseudo triangle wave or pseudo trapezoid wave having a certain ratio between a rising slope and a falling slope. The circuit includes a constant current circuit connected to a first power supply, a current mirror circuit having an output connected to an output terminal and used to flow a current between the output and a second power supply, the current being n times (n: a positive real number) the current flowing between an input and the second power supply; a switching circuit that outputs a current to the output terminal, the current to be flown to the constant current circuit when the input signal is on a first level and outputs a current to the input, the current to be flown to the constant current circuit when the input signal is on the second level, and a capacitance connected between the output terminal and a fixed potential.

The exemplary aspects, therefore, can provide a phase shifting circuit capable of setting a phase difference between an input signal and an output signal flexibly regardless of the input signal frequency. The exemplary aspects of the present invention can also provide a waveform generating circuit that generates a pseudo triangle or trapezoid waveform having a certain ratio between the rising slope and the rising slope.

BRIEF DESCRIPTION OF THE DRAWINGS

The above and other exemplary aspects, advantages and features of the present invention will be more apparent from the following description of certain exemplary embodiments taken in conjunction with the accompanying drawings, in which.

DETAILED DESCRIPTION OF THE EXEMPLARY EMBODIMENTS

Figure 1:
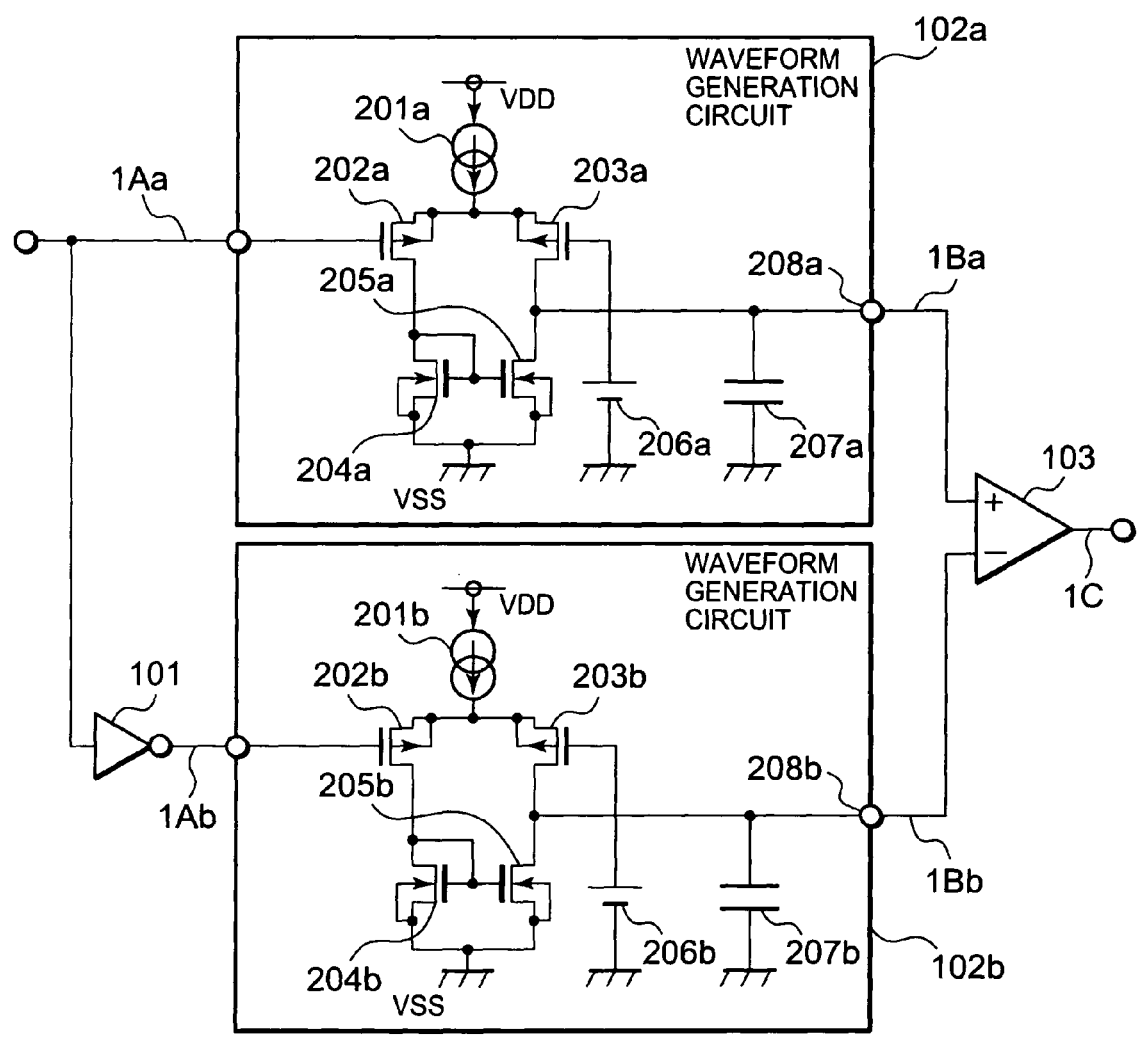
FIG. 1 is a block diagram of a phase shifting circuit in an exemplary embodiment of the present invention.
Figure 2:
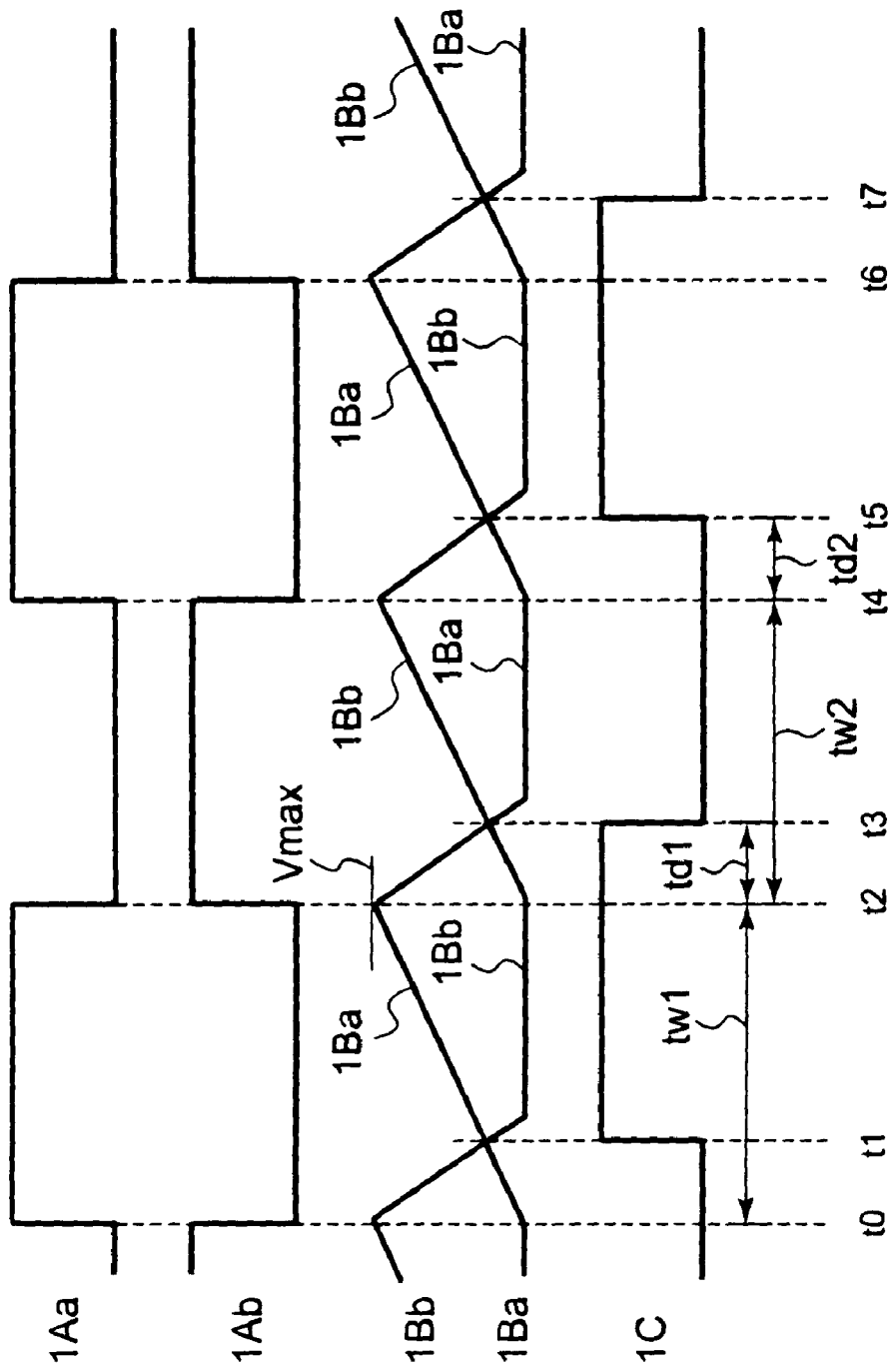
FIG. 2 is a timing chart of the phase shifting circuit shown in FIG. 1.

As shown in FIGS. 1 and 2, the phase shifting circuit in an exemplary embodiment of the present invention includes a first wave generation circuit (102a) that inputs a first signal (1Aa) and outputs a first waveform (1Ba); a second waveform generating circuit (102b) that inputs an inverted signal (1Ab) of the first signal and outputs a second waveform (1Bb); and a comparator (103) that inputs the first and second waveforms and outputs a signal (1C) having a predetermined phase difference from the first signal; each of the first and second waveform generating circuits includes a constant current circuit (201a, 201b) connected to a first power supply VDD); a current mirror circuit (204a, 205a, 204b, 205b) having an output connected to an output terminal (208a, 208b) and used to flow a current between the output and a second power supply, the current being n times (n: a real number of 1 or more) the current being flown between an input and the second power supply (VSS); a switching circuit (202a, 203a, 202b, 203b) that outputs a current to the output terminal, the current to be flown to the constant current circuit when an input signal (1Aa, 1Ab) to the waveform generating circuit is on a first level and outputs a current to the input, the current to be flown to the constant current circuit when the input signal is on a second level; and a capacitance (207a, 207b) connected between the output terminal and a fixed potential. The predetermined phase difference between the signals output from the comparator depends on the n value of the current mirror circuit.

In other words, the waveform generating circuit described above flows a constant current between the first power supply and the output terminal when the input signal is on the first level and flows a constant current that is n times the above one between the output terminal and the second power supply when the input signal is on the second level. Consequently, when the input signal is on the first level, the output terminal voltage rises (falls) from the second power supply at a certain slope and when the input signal level changes from the first level to the second level, the output terminal voltage rises (falls) up to the second voltage from the peak (Vmax) of the rising (falling) at a slope that is n times the certain slope. The rising and falling timings are reversed between the first waveform output from the first waveform generating circuit and the second waveform output from the second waveform generating circuit, thereby the first and second waveforms come to cross each other at a delay from the input signal just by the time that depends on the rising (falling) slope and the peak height (Vmax). Thus the lower the input signal frequency is, the higher the peak (Vmax) becomes and the longer the time between the input signal level change and the crossing by the first and second waveforms becomes. However, even when the input signal frequency changes, the rising and falling slopes are kept as are. Therefore, even when the input signal frequency changes, the phase delay angle output from the phase shifting circuit is kept as is. Furthermore, if the ratio n of the output current with respect to the input current to the current mirror circuit is changed, then the phase shifting degree of the phase shifting circuit can be changed flexibly.

Furthermore, because the waveform generating circuit generates waveforms according to the current to be flown to the constant current circuit, the waveform rising and falling slopes can be fixed. The current mirror circuit current flow ratio can be changed flexibly to change the rate of the rising/falling slope flexibly. Furthermore, the switching circuit can generate waveforms synchronously with the changes of the input signal.

The rising and falling of the first and second waveforms are reversed according to which of the first and second power supplies is used as the high potential power supply.

Hereunder, there will be described the exemplary embodiments of the present invention in detail with reference to the accompanying drawings.

First Exemplary Embodiment

FIG. 1 is a block diagram of a phase shifting circuit in a first exemplary embodiment. The phase shifting circuit includes a first waveform generating circuit 102a; a second waveform generating circuit 102b, and a comparator 103. The waveform generating circuit 102a inputs a first signal 1Aa as is. The first signal 1Aa is an input signal to the whole phase shifting circuit. The first input signal 1Aa is also inputted to an inverter 101 so as to be inverted therein. The inverted signal is then inputted to the second waveform generating circuit 102b. The first waveform signal 1Ba output from the first waveform generating circuit 102a is inputted to a plus input terminal of the comparator 103 while the second waveform signal 1Bb output from the second waveform generating circuit 102b is inputted to a minus input terminal of the comparator 103. The comparator 103 outputs a signal 1C having a certain phase difference from the first signal 1Aa.

Next, there will be described the configurations of the first waveform generating circuit 102a and the second waveform generating circuit 102b. The configuration is the same between the first and second waveform generating circuits 102a and 102b, so that only the configuration of the waveform generating circuit 102a will be described here representatively. The first waveform generating circuit 102a includes a switching circuit consisting of a constant current circuit 201a, a P-channel type MOS transistor 202a, a P-channel type MOS transistor 203a, a current mirror circuit consisting of an N-channel type MOS transistor 204a and an N-channel type MOS transistor 205a; and a capacitor 207a.

The constant current circuit 201a is connected between a first power supply VDD and a switching circuit 202a/203a and flows a constant current received from the first power supply to the switching circuit. The P-channel type MOS transistor 202a of the switching circuit is connected to the drain of the N-channel type MOS transistor 204a of the current mirror circuit through one of its drain and source and to the constant current circuit 201a through the other of the drain and source. The gate of the P-channel type MOS transistor 202a inputs the first signal 1Aa. The P-channel type MOS transistor 203a is connected to the output terminal 208a of the waveform generating circuit through one of its drain and source and to the constant current circuit 201a through the other of the drain and source. The gate of the P-channel type MOS transistor 203a is connected to a reference power supply 206a.

The source of the N-channel type MOS transistor 204a of the current mirror circuit is connected to a second power supply VSS. The gate and drain of the MOS transistor 204a are also connected to the gate of the N-channel type MOS transistor 205a. The source of the N-channel type MOS transistor 205a is connected to the second power supply VSS and the drain thereof is connected to the output terminal 208a of the waveform generating circuit. One end of the capacitor 207a is connected to the second power supply VSS. The other end thereof is connected to output terminal 208a of the waveform generating circuit, one of the drain and source of the P-channel type MOS transistor 203a, and the drain of the N-channel type MOS transistor 205a respectively. The drain and gate of the N-channel type MOS transistor 204a function as inputs of the current of the current mirror circuit respectively and the drain of the N-channel type MOS transistor 205a functions as an output of the current.

FIG. 2 is a timing chart of a phase shifting circuit in the first exemplary embodiment. Hereunder, there will be described the operations of the phase shifting circuit in the first exemplary embodiment.

In FIG. 2, the first signal 1Aa and the inverted signal 1Ab of the first signal are rectangle wave signals, both of which levels are alternated cyclically between High and Low. The inverted signal 1Ab is an input signal having a phase shifted by 180° from that of the first signal 1Aa. The waveform generating circuits 102a and 102b are basically the same in configuration and operation. However, they come to operate in a different phase of 180° from each other according to the difference between their input signal phases. Hereunder, the operations of the waveform generating circuits 102a and 102b will be described with reference to the waveform generating circuit 102a.

The first signal 1Aa is supplied to the gate of the P-channel type MOS transistor 202a which is paired differentially with the P-channel type MOS transistor 203a connected to the reference power supply through its gate. The sources of the differential pair of the P-channel type MOS transistors 202a and 203a are short-circuited. If the potential of the first signal 1Aa is higher than that of the reference power supply 206a, then the P-channel type MOS transistor 202a is turned off and the P-channel type MOS transistor 203a is turned on. If the potential of the first signal 1Aa is lower than that of the reference power supply 206a, then the P-channel type MOS transistor 202a is turned on and the P-channel type MOS transistor 203a is turned off. This means that this differential pair of the P-channel type MOS transistors 203a and 202a comes to function as a switching circuit that turns on/off according to the first signal 1Aa. The potential supplied from the reference power supply 206a to the gate of the P-channel type MOS transistor 203a is a half of the High/Low potential of the first signal 1Aa.

The sources of both the P-channel type MOS transistors 202a and 203a are connected to the constant current circuit 201a respectively. Therefore, if the P-channel type MOS transistor 202a is turned on, then the current of the constant current circuit 201a is flown from the source to the drain of the P-channel type MOS transistor 202a. If the P-channel type MOS transistor 203a is turned on, then the current of the constant current circuit 201a is flown from the source to the drain of the P-channel type MOS transistor 203a.

Furthermore, when the P-channel type MOS transistor 202a is turned on, the current of the constant current circuit 201a is flown from the drain to the source of the N-channel type MOS transistor 204a. The N-channel type MOS transistors 204a and 205a are current mirror circuits consisting of transistor elements having the same channel type and the same characteristics respectively. Consequently, the current flowing from the drain to the source of the N-channel type MOS transistor 205a is a current obtained by multiplying a size ratio between the N-channel type MOS transistors 204a and 205a to the current being flown from the drain to the source of the N-channel type MOS transistor 204a. Here, the size ratio between the N-channel type MOS transistors 204a and 205a is assumed to be 1 : n (n: a real number of 1 or more). Thus the current being flown in the N-channel type MOS transistor 205a is assumed to be a current that is n times that being flown in the N-channel type MOS transistor 204a.

This means that when the P-channel type MOS transistor 202a is turned on, a current that is n times that being flown in the constant current circuit 201a comes to flow from the drain to the source of the N-channel type MOS transistor 205a. However, note that when the potential of the drain of the N-channel type MOS transistor 205a is the same as that of the second power supply VSS, the current does not flow to the source. When the P-channel type MOS transistor 203a is turned on, the P-channel type MOS transistor 202a is turned off. Thus, no current flows into the N-channel type MOS transistor 204a, so that the N-channel type MOS transistor 205a is turned off and no current flows.

Next, there will be described the potential of the drain of the N-channel type MOS transistor 205a to which the capacitor 207a is connected. While the level of the first signal 1Aa is Low, the capacitor 207a is discharged by the current of the drain of the N-channel type MOS transistor 205a. Until the level of the first signal 1Aa is changed to High, the potential of the drain of the N-channel type MOS transistor 205a is assumed to be kept at the same potential of that of the second power supply VSS, which is used as a reference potential.

If the level of the first signal 1Aa is changed to High at the time t0 in this case, then the capacitor 207a is charged by the current of the drain of the P-channel type MOS transistor 203a, that is, a constant current being flown in the constant current circuit 201a. At this time, the potential of the drain of the N-channel type MOS transistor 205a keeps rising at a certain slope up to the time t2 on which the High period of the first signal 1Aa is ended.

Thereafter, when the first signal 1Aa enters the low period, the capacitor 207a is discharged from the potential of the drain of the N-channel type MOS transistor 205a. The potential is obtained at the time t2 due to the current of the drain of the N-channel type MOS transistor 205a, that is, due to the constant current that is n times that supplied from the constant current circuit 201a. At this time, while the level of the first signal 1Aa is High, the potential of the drain of the N-channel type MOS transistor 205a falls to the potential of the second power supply VSS at a slope that is n times that assumed when the potential rises due to the charging of the capacitor 207a. The charging is made by the current of the drain of the P-channel type MOS transistor 203a.

Consequently, the potential of the drain of the N-channel type MOS transistor 205a rises and falls repetitively each time the level of the first signal 1Aa is switched between High and Low, thereby the potential becomes a sawtooth wave (triangle wave) that appears in the first waveform 1Ba as shown in FIG. 2.

In other words, the waveform generating circuit 102a inputs (e.g. receives) the first signal 1Aa and outputs the first waveform 1Ba through its output terminal 208a. The waveform 1Ba is then supplied to the plus input terminal of the comparator 103. On the other hand, the waveform generating circuit 102b inputs the inverted signal 1Ab of the first signal, which comes to have a phase shifted by 180° from the first waveform 1Ba, then outputs a second waveform 1Bb through its output terminal 208b. The waveform 1Bb is then supplied to the minus input terminal of the comparator 103.

The comparator 103 then makes a comparison between the two sawtooth waveform signals of which phases are shifted by 180° from each other. Those two signals are inputted to the plus and minus terminals of the comparator 103 respectively, which then outputs a signal 1C. The level of the output signal 1C becomes High when the potential of the first waveform 1Ba is higher than that of the second waveform 1Bb and becomes low when the potential of the first waveform 1Ba is lower than that of the second waveform 1Bb. The cross-point where the levels of the first and second waveforms 1Ba and 1Bb are replaced with each other is delayed with respect to the rising or falling of the first signal 1Aa. Therefore, the output signal 1C of the comparator 103 is delayed from the first signal 1Aa.

The output signal 1C is delayed from the first signal 1Aa by a time td1, which means a period between the falling of the first signal 1Aa and the falling of the output signal 1C and by a time td2, which means a period between the rising of the first signal 1Aa and the rising of the output signal 1C. Each of the delay times means a period between the rising or falling of the first signal 1Aa and when the potentials of the first and second waveforms 1Ba and 1Bb become the same and cross each other.

When the first signal 1Aa begins rising, the potential of the first waveform 1Ba begins rising from the potential of the second power supply VSS at a certain slope. The potential of the first waveform 1Ba keeps rising at the certain slope while the level of the first signal 1Aa is High. Thus, the potential is kept at a level determined by the length of the High level period of the first signal 1Aa and the rising slope thereof. In this case, it is premised that the potential of the first waveform 1Ba does not reach the potential of the first power supply VDD while the level of the first signal 1Aa is High. When the first signal 1Aa begins falling, the first waveform 1Ba begins falling from the potential of its rising peak at a certain slope. If it is assumed here that the peak potential is represented as Vmax (Vmax≦VDD), then the High level period of the first signal 1Aa is represented as tw1, the current flowing in the constant current circuit 201a in the waveform generating circuit 102a is represented as I, and the capacitance value of the capacitor 207a is represented as Cap, the Vmax can thus be represented as follows in the equation (1).

$$V\mathrm{max}=I \cdot tw1/\mathrm{Cap} \quad \text{Equation (1)}$$

Here, the time elapsed after the falling of the first signal 1Aa is represented as td1 and the potential of the first waveform 1Ba is represented as Vf. In the waveform generating circuit 102a, the drain current of the N-channel type MOS transistor 205a used to discharge the capacitor 207a is n times the current flowing in the constant current circuit 201a as described above. Then, if the Vmax relational equation described above is used, then the Vf value can be represented as follows in the equation (2).

$$Vf=V\mathrm{max}-n \cdot I \cdot td1/\mathrm{Cap} \quad \text{Equation (2)}$$

Furthermore, the above equation (1) of the Vmax is substituted for the equation (2) to represent the Vf value as follows.

$$Vf=\{(td1-n \cdot td1) \cdot I\}/\mathrm{Cap} \quad \text{(3)}$$

Here, the potential of the second waveform 1Bb is represented as Vr. Then, because the waveform generating circuits 102a and 102b are the same in configuration, the current flowing in the constant current circuit 201b in the waveform generating circuit 102b is represented as I and the capacitance value of the capacitor 207b is represented as Cap. Thus, the Vr can be represented as follows in the equation (4).

$$Vr=I \cdot td1/\mathrm{Cap} \quad \text{Equation (4)}$$

The time td1 required between the time t2 and when the potential Vf of the first waveform 1Ba and the potential Vr of the second waveform 1Bb become the same is represented as follows in the equation (6) by using the relationship among the equations (3) and (4) in which the above Vf and Vr, and the equation (5).

$$Vf=Vr \quad \text{Equation (5)}$$

$$\{(td1-n \cdot td1) \cdot I\}/\mathrm{Cap}=I \cdot td1/\mathrm{Cap} \quad \text{Equation (6)}$$

This can be rearranged to obtain the time td1 as follows in the equation (7).

$$td1=tw1/(1+n) \quad \text{Equation (7)}$$

In other words, after the time of 1/(1+n) of the high level period tw1 between the falling and just before the falling of the first signal 1Aa, the first waveform 1Ba and the second waveform 1Bb come to have the same potential. Thus, the level of the output signal 1C of the comparator 103 comes to change from High to Low.

Similarly, it is possible to obtain a period of time td2 (t5) between the rising of the first signal (t4) and when the first and second waveforms 1Ba and 1Bb come to have the same potential (t5). In other words, it is possible to replace the rising with the falling of the first signal 1Aa, which is an input to the waveform generating circuit 102a and replace the rising with the falling of the first waveform 1Ba, which is an output from the waveform generating circuit 102a, replace the rising with the falling of the inverted signal 1Ab of the first signal, which is an input to the waveform generating circuit 102b, and replace the rising with the falling of the second waveform 1Bb, which is an output from the waveform generating circuit 102b respectively.

Here, if it is assumed that the Low period just before the rising of the first signal 1Aa is represented as tw2, then the td2 can be represented as follows in the equation (8).

$$td2=tw2/(1+n) \quad \text{Equation (8)}$$

In other words, in a period between the time t4 at which the first signal 1Aa rises and the time t5, which is assumed after the lapse of 1/(1+n) of the low level period tw2 just before the rising of the first signal 1Aa, the first and second waveforms 1Ba and 1Bb come to have the same potential and the level of the output signal 1C of the comparator 103 changes from Low to High.

The above descriptions can thus be summarized as follows. The rising of the output signal 1C is delayed from the rising of the first signal 1Aa by a time 1/(1+n) of the period tw2 in which the level of the signal 1Aa is Low just before the rising. The falling of the output signal 1C is delayed from the falling of the first signal 1Aa by a time of 1/(1+n) of the period tw1 in which the level of the signal 1Aa is High just before the falling of the 1Aa. The tw1 and tw2 represent times on which the first signal 1Aa keeps High and Low levels respectively. If the duty ratio of the first signal 1Aa is 50%, therefore, then the tw1 and the tw2 become equal. Consequently, if one cycle of the first signal 1Aa is represented as T1, then the tw1 and the tw2 have the following relationship in the equation (9).

$$tw1 = tw2 = T1/2 \quad \text{Equation (9)}$$

If the equation (9) is substituted for the equation (7), then the equation (7) will be rewritten to the equation (10) as follows.

$$td1 = T1/\{(1+n)\cdot 2\} \quad \text{Equation (10)}$$

If the equation (9) is substituted for the equation (8), then the equation will be rewritten to the equation (11) as follows.

$$td2 = T1/\{(1+n)\cdot 2\} \quad \text{Equation (11)}$$

In other words, if the duty ratio of the first signal 1Aa is 50%, then a period of time td1 between the rising of the first signal 1Aa and the rising of the output signal 1C becomes equal to a period of time td2 between the falling of the first signal 1Aa and the falling of the output signal 1C. If td1 and td2 are assumed to be td that represents the delay time of the output signal 1C with respect to the first signal 1Aa, then the td is represented as follows in the equation (12) on the basis of the equation (10) or (11).

$$td = T1/\{(1+n)\cdot 2\} \quad \text{Equation (12)}$$

In other words, if the duty ratio of the first signal 1Aa is 50%, then the delay time of the output signal 1C from the first signal 1Aa becomes $1/\{(1+n)\cdot 2\}$ of one cycle of the first signal 1Aa.

As described above, the "n" in the equation (12) represents a size ratio between the N-channel type MOS transistor 204a and the N-channel type MOS transistor 205a of the current mirror circuit in the waveform generating circuit 102a. The "n" also represents a size ratio between the N-channel type MOS transistor 204b and the N-channel MOS type transistor 205b of the current mirror circuit in the waveform generating circuit 102b. Consequently, any "n" value can be set in the designing stage. If the constant current circuit and the current mirror circuit are configured ideally and the two waveform generating circuits are the same in characteristics, then the delay time td of the output signal 1C from the first signal 1Aa can assume a certain ratio of time that depends on only the "n" size ratio between the current mirror circuits with respect to one cycle T1 of the first signal 1Aa as shown in the equation (12).

Because any value can be set for the "n" in the equation (12), it is possible to obtain a desired phase difference. For example, if "3" is set for the "n", the output signal 1C can be delayed from the first signal 1Aa by ⅛ of one cycle of the first signal 1Aa, then thereby the phase shifting degree becomes 45° as shown in the equation (12). However, because the potentials of the first and second waveforms 1Ba and 1Bb are required to be fallen to the potential of the second power supply VSS before they rise respectively, the "n" value can be limited within a range of real numbers of 1 or more. Consequently, as shown in the equation (12), the phase difference between the input signal and the output signal, to be obtained by the phase shifting circuit in the first exemplary embodiment, is limited within 0 to ¼ cycles.

In the equation (12), there are no elements for the current values I of the constant current circuits 201a and 201b and for the capacitance values Cap of the capacitors 207a and 207b in the waveform generating circuits 102a and 102b respectively. However, in the equation (12), it is assumed that the current value is equal between the constant current circuits 201a and 201b and the capacitance value is equal between the capacitors 207a and 207b. Consequently, if constant current circuits having the same current value and having relative values within a certain range are used for the constant current circuits 201a and 201b respectively and capacitors having the same capacitance value and having relative values within a certain range are used for the capacitors 207a and 207b respectively, then the current values of the constant current circuits 201a and 201b and the capacitance value of the capacitors 207a and 207b do not affect the delay time td of the output signal at all.

The "n" in the equation (12) represents a size ratio between the N-channel type MOS transistors 204a and 205a of the current mirror circuit in the waveform generating circuit 102a. The "n" also represents a size ratio between the N-channel type MOS transistors 204b and 205b of the current mirror circuit in the waveform generating circuit 102b. It is a ratio between the input and output currents of the current mirror circuit.

Generally, the ratio between the input and output currents of a current mirror circuit is determined by the relative value of the characteristics of each transistor. Consequently, if transistors having characteristic relative values among them within a certain range are used for the N-channel type MOS transistors 204a and 205a, as well as for the N-channel type MOS transistors 204b and 205b respectively, then the "n" value is fixed, thereby the ratio between the delay time td of the output signal 1C and the one cycle T1 of the first signal 1Aa comes to be fixed.

In a phase shifting circuit, if an output signal delay time from the subject input signal is kept within a time of a certain ratio with respect to one cycle of the input signal, then the degree of the phase to be shifted, that is, the phase shifting degree is kept as is regardless of the input signal frequency changes. This is because there is the following relationship among the frequency, the one cycle time, the phase value, and the time represented by the phase value of a cyclical signal.

The equation (13) represents such a relationship among the time t, the cyclical signal phase value θ, and the cyclical signal one cycle T as follows.

$$\theta = t/(T/360) = 360 \cdot t/T \quad \text{Equation (13)}$$

The relationship between the cycle T and the frequency f of a cyclical signal is represented as follows in the equation (14).

$$T = 1/f \quad \text{Equation (14)}$$

This means that if the frequency of a cyclical signal changes, then the cycle T also changes due to the relationship shown in the equation (14). However, even when the cycle T changes and accordingly the time t changes, if the ratio between the time t and the cycle T is fixed, then the phase value θ is also fixed. Such a relationship among them is represented in the equation (13).

As described above, according to the first exemplary embodiment, if the duty ratio of the first signal inputted to a subject phase shifting circuit is 50%, then the phase shifting circuit can output a signal having a phase difference set beforehand with respect to the first signal regardless of the first signal frequency. This phase difference of the phase shifting circuit can be set according to the current ratio n of the current mirror circuit.

The first exemplary embodiment described above can be varied and applied in various ways. For example, while the first power supply voltage VDD of the waveform generating circuit is set higher than that VSS of the second power supply in the first exemplary embodiment, it is possible to set the first power supply voltage VDD higher than the VSS of the second power supply. In this case, it is just required to reverse each of the level (High/Low) of the first signal 1Aa, the current flowing direction, and the rising/falling of the waveform. At this time, it is also required to reverse the conductivity of each MOS transistor used in the subject current mirror circuit.

While each waveform generating circuit is composed of MOS transistors in the first exemplary embodiment, those MOS transistors may be replaced with any other functional elements such as bipolar transistors, etc. to configure the current mirror circuit and the switching circuit if those current mirror and switching circuits can realize their predetermined functions.

Furthermore, while a differential pair of switching circuits is used in the first exemplary embodiment, the switching circuit pair may be replaced with a pair of switching circuits in any configuration if each of the circuits can switch a constant current flow between the current mirror circuit and the output terminal in response to an input signal. While one end of each of the capacitors 207a and 207b is connected to the second power supply VSS, it may also be connected to any element that has a fixed potential.

Second Exemplary Embodiment

Figure 3:
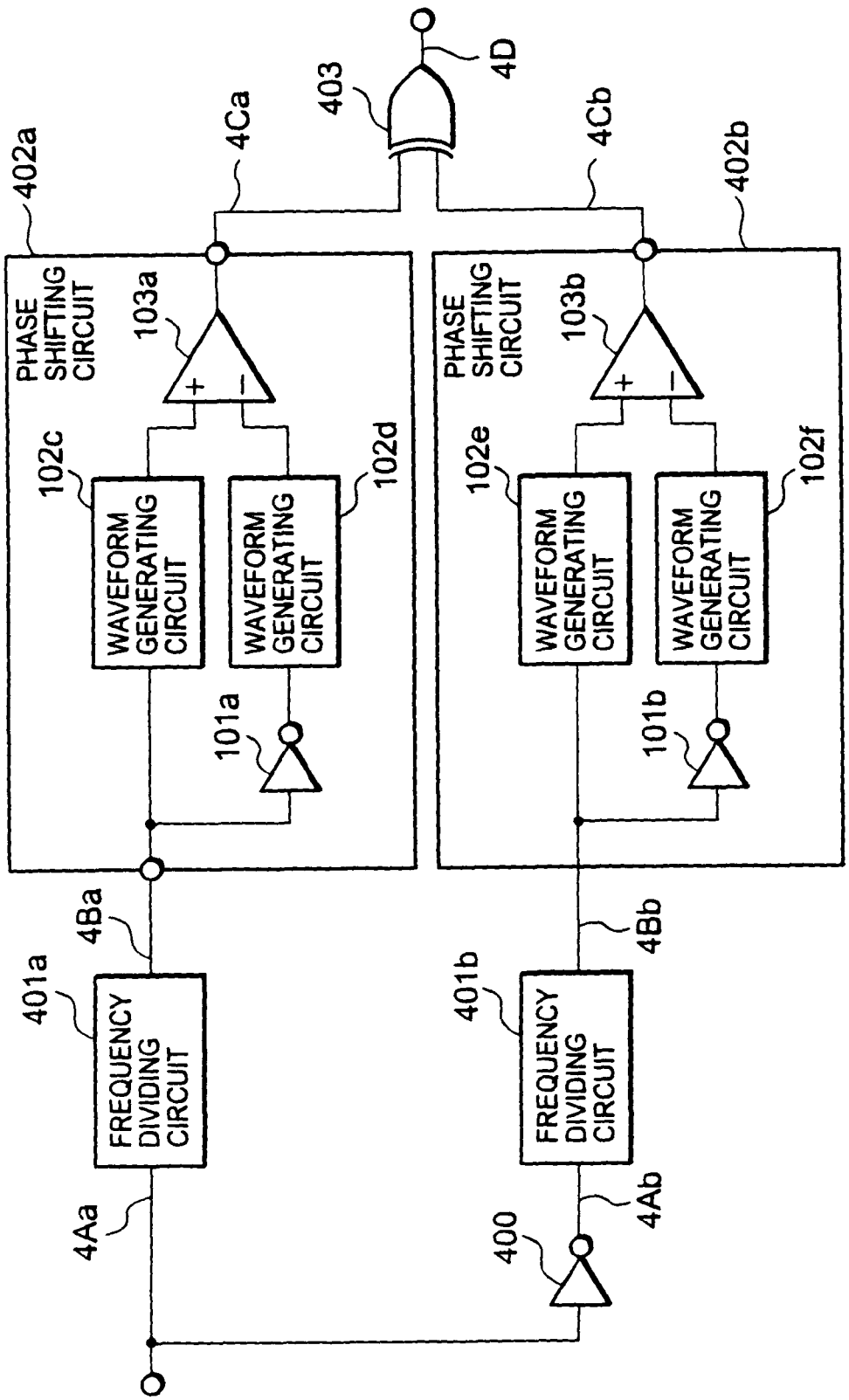
FIG. 3 is a block diagram of a phase shifting circuit in another exemplary embodiment of the present invention.

FIG. 3 is a block diagram of a phase shifting circuit in a second exemplary embodiment. In the first exemplary embodiment, the duty ratio of the inputted first signal must be 50% to obtain an ideal phase shifting degree. In the second exemplary embodiment, however, the phase shifting circuit is not limited in such a way. The phase shifting circuit shown in FIG. 4 is configured to include frequency dividing circuits 401a and 401b, an inverter 400, phase shifting circuits 402a and 402b, an exclusive logical sum (XOR) circuit 403.

An input signal 4Aa is inputted to an input terminal of the frequency dividing circuit 401a and to an input terminal of the inverter 400. An output terminal of the frequency dividing circuit 401a is connected to the input terminal of the phase shifting circuit 402a. The output terminal of the phase shifting circuit 402a is connected to one input terminal of the exclusive logical sum (XOR) circuit 403. The output terminal of the inverter 400 is connected to the input terminal of the frequency dividing circuit 401b and the output terminal of the frequency dividing circuit 401b is connected to the input terminal of the phase shifting circuit 402b. The output terminal of the phase shifting circuit 402b is connected to the other input terminal of the exclusive logical sum (XOR) circuit 403. The output terminal of the exclusive logical sum (XOR) circuit 403 outputs a signal having a predetermined phase difference with respect to the input signal 4Aa. Each of the phase shifting circuits 402a and 402b is the same as that used in the first exemplary embodiment shown in FIG. 1.

Figure 4:
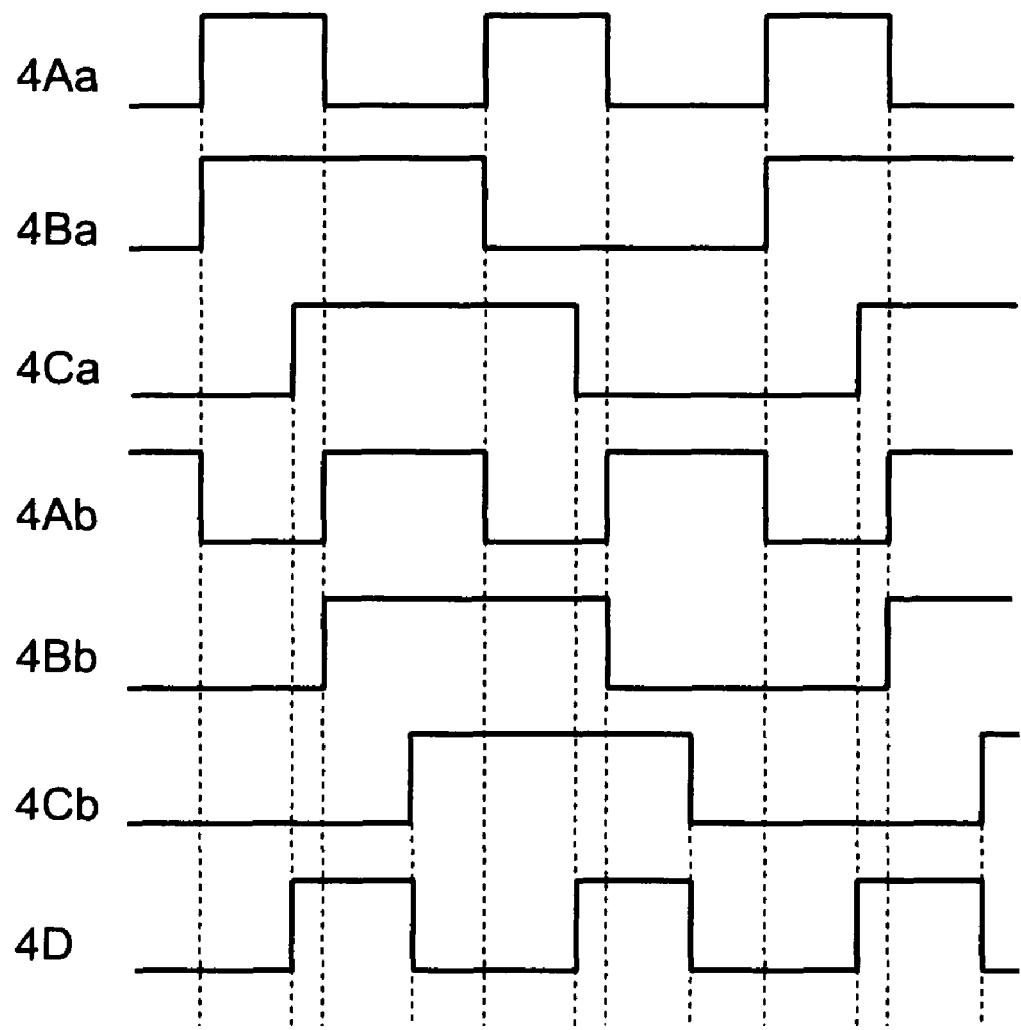
FIG. 4 is a timing chart of the of the phase shifting circuit shown in FIG. 3.
Figure 5:
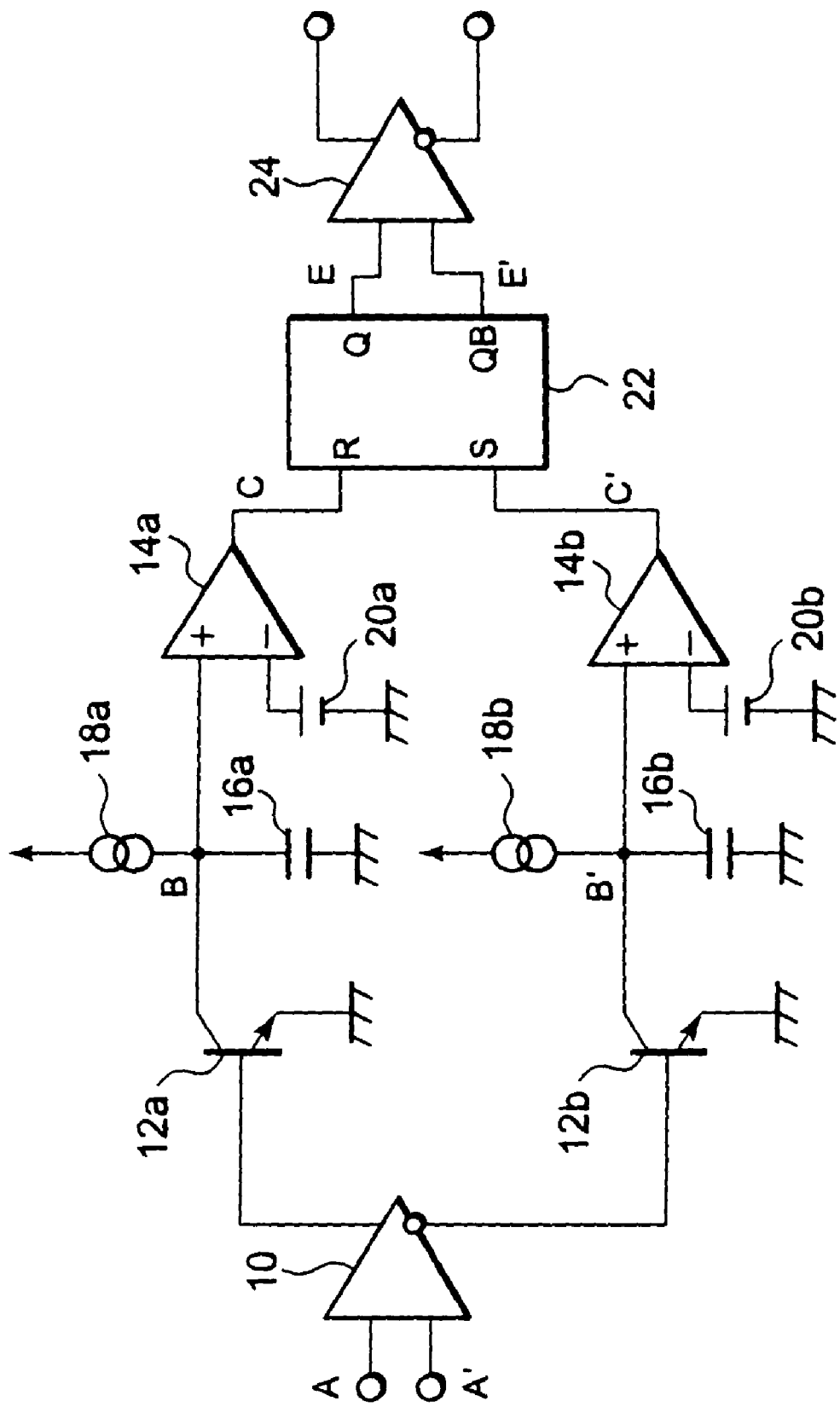
FIG. 5 is a block diagram of a conventional phase shifting circuit disclosed in the patent document 1.

FIG. 4 is a timing chart of the phase shifting circuit in this second exemplary embodiment. Hereunder, there will be described the operations of the phase shifting circuit in this second exemplary embodiment with reference to the block diagram shown in FIG. 3, as well as the timing chart shown in FIG. 4. In FIG. 4, the second signal 4Aa and its inverted signal 4Ab that are inputted to the phase shifting circuit in this second exemplary embodiment are rectangle waveform signals of which levels are switched between High and Low cyclically. The phases are opposite to each other; there is a difference of 180° between those phases.

The frequency dividing circuit 401a inputs the second signal 4Aa and outputs a frequency dividing signal 4Ba that is inverted at each rising of the second signal 4Aa. This means that the frequency dividing signal 4Ba is divided into two parts synchronously with the rising of the second signal 4Aa.

Here, the cycle of the output signal 4Ba with respect to the input signal 4Aa of the frequency dividing circuit becomes double, but its frequency becomes a half. Therefore, when the second signal 4Aa is divided into two parts and if the cycle of the second signal 4Aa is fixed, the duty ratio of the frequency dividing signal 4Ba becomes 50% regardless of the duty ratio of the second signal 4Aa.

Because the duty ratio of the frequency dividing signal 4Ba is 50%, the phase shifting circuit 402a having the same configuration as that of the phase shifting circuit in the first exemplary embodiment shown in FIG. 1 receives the frequency dividing signal 4Ba and outputs a signal 4C having a certain phase difference with respect to the frequency dividing signal 4Ba as described in the first exemplary embodiment.

The frequency dividing circuit 401b, upon receiving an inverted signal 4Ab of the second signal 4Aa, outputs a frequency dividing signal 4Bb that is inverted at each rising of the inverted signal 4Ab. This means that the frequency dividing signal 4Bb divides the second signal 4Aa into two parts synchronously with the falling of the second signal 4Aa. And because the duty ratio of the frequency dividing signal 4Bb is 50% at this time, the phase shifting circuit 402b having the same configuration as that of the phase shifting circuit 402a outputs a signal 4Cb having a certain phase difference with respect to the frequency dividing signal 4Bb just like the phase shifting circuit 402a.

The exclusive logical sum (XOR) circuit 403, upon receiving the phase shifting circuit output signals 4Ca and 4Cb, outputs a signal 4D. The level of the output signal 4D is Low when the levels of the signals 4Ca and 4Cb are High or Low respectively. The level of the signal 4D becomes High when the levels of the signals 4Ca and 4Cb are different from each other, that is, one of their levels is High/Low and the other is Low/High. In the second exemplary embodiment, the output signal 4D rises synchronously with the rising or falling of the signal 4Ca and falls synchronously with the rising or falling of the signal 4Cb. Because the phase of the frequency dividing signal 4Ba precedes that of the frequency dividing signal 4Bb in the second exemplary embodiment, the relationship between those signals becomes as described above. However, the phase of the signal 4Bb might precede that of the signal 4Ba according to the initial setting of the frequency dividing circuit. Concretely, in FIG. 4, the phase of the frequency dividing signal 4Ba or 4Bb might be shifted by 180°. Even in this case, the waveform as shown in FIG. 4 is obtained according to the relationship between the second signal 4Aa and the output signal 4D if the exclusive logical sum (XOR) circuit 403 is replaced with a negative exclusive logical sum (or XNOR gate circuit). Needless to say, the relationship between the phases of the frequency dividing signals 4Ba and 4Bb can be determined uniquely with use of the initial setting circuit for the frequency dividing signals 4Ba and 4Bb.

Here, the level of the frequency dividing signal 4Ba changes synchronously with the rising of the second signal 4Aa and the signal 4Ca output from the phase shifting circuit has a phase shifted from the frequency dividing signal 4Ba by a degree determined by the phase shifting circuit 402a. The rising of the output signal 4D synchronizes with the change timing of the signal 4Ca. Therefore, the rising of the output signal 4D is finally delayed by a shifting degree determined by the phase shifting circuit 402a from the rising of the second signal 4Aa, which is an input signal to this whole phase shifting circuit. Similarly, the falling of the output signal 4D is delayed by a shifting degree determined by the phase shifting circuit 402b from the falling of the second signal 4Aa.

Consequently, if the same shifting degree is set for both of the phase shifting circuits 402a and 402b, then the output signal 4D comes to have a phase difference delayed by a shifting degree determined by the those phase shifting circuits 402a and 402b from the second signal 4Aa in both rising and falling. Furthermore, in the phase shifting circuit in the second exemplary embodiment, the second signal 4Aa is divided into two parts before it is inputted to the phase shifting circuits 402a and 402b. Thus, if the second signal 4Aa is a cyclical signal, then its duty ratio is not required to be 50%.

Because the phase shifting circuits 402a and 402b are the same as those in the first exemplary embodiment, the signal delay time determined by those circuits 402a and 402b can be set within ¼ of one cycle of the input signal. Each signal to be inputted to those circuits 402a and 402b is a signal obtained by dividing the second signal 4Aa into two parts and the signal 4Aa is an input signal to the whole phase shifting circuit in this second exemplary embodiment. Therefore, in the whole phase shifting circuit in this second exemplary embodiment, the delay time can be set within ½ of one cycle of the second signal 4Aa. The phase of the input signal can also be shifted easily by 180° by using such an inverting element as an inverter or the like. Thus it is just required to add an inverter to the input or output to or from the phase shifting circuit shown in FIG. 3 or replace the exclusive logical sum (XOR) circuit 403 with a negative exclusive logical sum circuit (or XNOR gate circuit) to realize the phase shifting circuit of the present invention, which is capable of obtaining a signal having any phase shifting with respect to an input signal regardless of the input signal frequency.

Third Exemplary Embodiment

In the first and second exemplary embodiments, descriptions have been made for how to realize a phase shifting circuit capable of obtaining any phase difference with respect to each input signal regardless of the input signal frequency by using the waveform generating circuits 102a and 102b.

The waveform generating circuit described in the first and second exemplary embodiments can also be used for circuits other than phase shifting circuits. In other words, the waveform generating circuit of the present invention can have a certain ratio between rising and falling slopes. This ratio between rising and falling slopes, as described in the first exemplary embodiment, can be set according to the current ratio of the subject current mirror circuit. If a waveform generating circuit is used independently, then it is not required to limit the current ratio n of the current mirror to 1 or more. A positive real number can be set for the n value. If the waveform generating circuit in the first exemplary embodiment is used as is and the input signal level is kept for a long period, then the output waveform never rises over the first power supply voltage VDD. Thus when the output waveform rises up to the VDD, it will be saturated there. If the input signal is inverted, however, then the signal falls from the first power supply voltage VDD at a predetermined slope, so that no special problem will occur. In other words, the third exemplary embodiment can realize a waveform generating circuit having certain rising and falling slopes, but the frequency of the input signal is used to determine whether the waveform generating circuit will output a pseudo triangle waveform or a pseudo trapezoid waveform in which the peak of the triangle is saturated.

As described above, each of the first and second exemplary embodiments can obtain a phase shifting circuit specially preferred to a gyro-sensor, etc. The third exemplary embodiment can obtain a general-purpose waveform generating circuit.

While the preferred forms of the present invention have been described, it is to be understood that modifications will be apparent to those skilled in the art without departing from the spirit of the invention.

Further, it is noted that Applicant's intent is to encompass equivalents of all claim elements, even if amended later during prosecution.

What is claimed is:

1. A phase shifting circuit, comprising:
   a first waveform generating circuit that receives a first signal and outputs a first waveform;
   a second waveform generating circuit that receives an inverted signal of the first signal, and outputs a second waveform; and
   a comparator that receives the first and second waveforms and outputs a signal having a predetermined phase difference from the first signal,
   wherein each of the first and second waveform generating circuits includes:
   a constant current circuit connected to a first power supply;
   a current mirror circuit including an output connected to an output terminal and used to flow a current between the output and a second power supply, the current being n times (n: a real number of 1 or more) a current flowing between an input of the current mirror circuit and the second power supply;
   a switching circuit that outputs a current to flow to the constant current circuit when an input signal to the first or second waveform generating circuit is on a first level to the output terminal, and outputs a current to flow to the constant current circuit when the input signal is on a second level to the current mirror circuit; and
   a capacitance connected between the output terminal and a fixed potential,
   wherein the predetermined phase difference depends on the n value of the current mirror circuit.

2. The phase shifting circuit according to claim 1, wherein the switching circuit comprises:
   a first MOS (metal-oxide semiconductor) transistor of a first-conductivity type including a drain and a source, one of the drain and the source being connected to the constant current circuit, the other of the drain and the source being connected to the input of the current mirror circuit, and the first MOS transistor including a gate receiving the input signal; and
   a second MOS transistor of the first-conductivity type including a drain and a source, the one of the drain and the source being connected to the constant current circuit, the other of the drain and the source being connected to the output terminal, and the second MOS transistor including a gate receiving an intermediate potential between a potential of the first power supply and a potential of the second power supply.

3. The phase shifting circuit according to claim 1, wherein the current mirror circuit comprises:
   a first MOS transistor of a second-conductivity type connected to the second power supply through a source thereof and to the input of the current mirror circuit through a drain and a gate thereof respectively; and
   a second MOS transistor of the second-conductivity type connected to the second power supply through a source thereof, to the output of the current mirror circuit through a drain thereof, and to both the gate and the drain of the first MOS transistor through a gate of the second MOS transistor.

4. A phase shifting circuit, comprising:
a first waveform generating circuit that receives a first signal, and outputs a first waveform that rises or falls from a first voltage at a first slope when the first signal is on a first level and falls or rises up to the first voltage from a peak of a rising or falling at a second slope that is n times (n: a real number of 1 or more) the first slope when a level of the first signal changes from the first level to a second level;
a second waveform generating circuit that receives an inverted signal of the first signal and outputs a second waveform that rises or falls from the first voltage at substantially a same slope as the first slope when the first signal is on the second level and falls or rises to the first voltage from the peak of the rising or falling at substantially a same level as the second level when the level of the first signal changes from the second level to the first level; and
a comparator that receives the first and second waveforms, and outputs a signal having a phase difference that depends on the n value from the first signal.

5. The phase shifting circuit according to claim 1, further comprising:
a first frequency dividing circuit that divides a second signal into two parts synchronously with a falling of the second signal;
a second frequency dividing circuit that divides the second signal into two parts synchronously with a rising of the second signal;
a first phase shifting circuit that receives an output of the first frequency dividing circuit as the first signal;
a second phase shifting circuit that receives an output of the second frequency dividing circuit as the first signal; and
a gate circuit that composes signals output from the first and second phase shifting circuits.

6. The phase shifting circuit according to claim 5, wherein the gate circuit comprises an exclusive logical sum (XOR) or a negative exclusive logical sum (XNOR) circuit.

7. An apparatus comprising:
a first phase shifting circuit; and
a second phase shifting circuit,
wherein the comparator comprises a first comparator,
wherein the signal comprises a second signal,
wherein the first phase shifting circuit comprises the phase shifting circuit according to claim 4,
wherein the second phase shifting circuit comprises:
a third waveform generating circuit that receives a third signal, and outputs a third waveform that rises or falls from the first voltage at the first slope when the third signal is on the first level and falls or rises up to the first voltage from the peak of the rising or falling at the second slope when a level of the third signal changes from the first level to the second level;
a fourth waveform generating circuit that receives an inverted signal of the third signal and outputs a fourth waveform that rises or falls from the first voltage at substantially the same slope as the first slope when the third signal is on the second level and falls or rises to the first voltage from the peak of the rising or falling at substantially the same level as the second slope when the level of the third signal changes from the second level to the first level; and
a second comparator that receives the third and fourth waveforms, and outputs a fourth signal with a phase difference that depends on the n value from the third signal,
a first frequency dividing circuit that divides a fifth signal into two parts synchronously with a falling of the fifth signal to generate the first signal;
a second frequency dividing circuit that divides the fifth signal into two parts synchronously with a rising of the fifth signal to generate the third signal; and
a gate circuit that receives the second signal and the fourth signal to generate a signal with a phase difference that depends on the n value from the fifth signal.

8. The apparatus according to claim 7, wherein the gate circuit comprises an exclusive logical sum (XOR) or a negative exclusive logical sum (XNOR) circuit.

9. A method comprising:
generating a first signal in response to a level of an input signal;
generating a second signal in response to the level of the input signal;
comparing the first signal with the second signal; and
generating, based on a result of the comparing, an output signal with a phase different from a phase of the input signal,
wherein the generating of the first signal comprises:
generating, when the level of the input signal changes from a first level to a second level, the first signal that rises from a first voltage at a first slope; and
generating, when the level of the input signal changes from the second level to the first level, the first signal that falls from a voltage that the first signal reached while the level of the input signal was the second level to a voltage at a second slope that is n times the first slope, where n is a real number of at least 1, and
wherein the generating of the second signal comprises:
generating, when the level of the input signal changes from the second level to the first level, the second signal that rises from the first voltage at the first slope; and
generating, when the level of the input signal changes from the first level to the second level, the second signal that falls from a voltage that the second signal reached while the level of the input signal is the first level to a voltage at the second slope.

10. The method according to claim 9, wherein the generating of the first signal is by a first generating circuit,
wherein the generating of the second signal is by a second generating signal receiving an inverted signal of the first signal, and
wherein the comparing of the first signal with the second signal is by a comparator generating the phase of the output signal different from the phase of the input signal.

11. The method according to claim 9, wherein the generating of the first signal, the generating of the second signal, the comparing, and the generating of the output signal are by a phase shifting circuit.

12. The method according to claim 9, wherein the generating, based on the result of the comparing, of the output signal has a phase difference according to the n ratio between the second slope and the first slope.

* * * * *